(12) United States Patent
Lee

(10) Patent No.: US 9,396,777 B1
(45) Date of Patent: Jul. 19, 2016

(54) STACKED MEMORY DEVICE AND SYSTEM

(71) Applicant: SK hynix Inc., Icheon-si Gyeonggi-do (KR)

(72) Inventor: Dong Uk Lee, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 14/724,027

(22) Filed: May 28, 2015

(30) Foreign Application Priority Data

Jan. 5, 2015 (KR) ........................ 10-2015-0000579

(51) Int. Cl.
| | | |
|---|---|---|
| *G11C 7/00* | (2006.01) | |
| *G11C 7/22* | (2006.01) | |
| *G11C 8/06* | (2006.01) | |
| *G11C 8/18* | (2006.01) | |
| *G11C 29/00* | (2006.01) | |
| *G11C 5/02* | (2006.01) | |

(52) U.S. Cl.
CPC .. *G11C 7/22* (2013.01); *G11C 5/02* (2013.01); *G11C 8/06* (2013.01); *G11C 8/18* (2013.01); *G11C 29/00* (2013.01)

(58) Field of Classification Search
CPC .............. G11C 7/22; G11C 8/06; G11C 8/18; G11C 29/00
USPC ................................................. 365/193, 201
See application file for complete search history.

(56) References Cited

U.S. PATENT DOCUMENTS

| | | | | |
|---|---|---|---|---|
| 2008/0025115 | A1* | 1/2008 | Kim ................. | G11C 29/12015 365/193 |
| 2012/0092943 | A1* | 4/2012 | Nishioka ................ | G11C 16/20 365/191 |
| 2012/0262196 | A1* | 10/2012 | Yokou ............ | G01R 31/318513 324/750.3 |
| 2014/0159765 | A1* | 6/2014 | Kim ................. | G01R 31/31725 324/762.01 |
| 2015/0234010 | A1* | 8/2015 | Kim ................. | G01R 31/31703 714/735 |

FOREIGN PATENT DOCUMENTS

KR     1020140075347 A     6/2014

* cited by examiner

*Primary Examiner* — Toan Le
(74) *Attorney, Agent, or Firm* — William Park & Associates Ltd.

(57) ABSTRACT

A stack memory device may include a core chip and a base chip. The core chip may include a data receiver, a strobe signal generation unit, and a test register. The data receiver may be configured for receiving data outputted from the core chip through a first normal port. The strobe signal generation unit may be configured to generate a data strobe signal based on one of a normal strobe signal and a test strobe signal depending on an operation mode. The test register may store data outputted from the data receiver in response to the data strobe signal.

24 Claims, 8 Drawing Sheets

STACKED MEMORY DEVICE AND SYSTEM

CROSS-REFERENCE TO RELATED APPLICATION

The present application claims priority under 35 U.S.C. §119(a) to Korean application number 10-2015-0000579, filed on Jan. 5, 2015, in the Korean Intellectual Property Office, which is incorporated herein by reference in its entirety.

BACKGROUND

1. Technical Field

Various embodiments generally relate to a semiconductor device, and more particularly, to a stacked memory device and system.

2. Related Art

In order to increase integration of a semiconductor apparatus, a 3 dimensional (3D) semiconductor apparatus has been proposed. A 3D semiconductor apparatus may include a plurality of chips stacked and packaged in a single package. The 3D semiconductor apparatus achieves maximum integration in a given space by vertically stacking two or more chips.

According to some 3D semiconductor apparatuses, a plurality of the same type of chips are stacked. The plurality of the same type of chips are coupled to one another through metal line like wires. In this way, the plurality of the same type of chips operate as a single semiconductor apparatus.

Some 3D semiconductor apparatuses may implement "Through Silicon Via" (TSV). The TSV may electrically couple all of a plurality of stacked chips by penetrating the plurality of stacked chips with "via". A semiconductor apparatus having the TSV structure vertically penetrating and coupling each of the plurality of chips effectively reduces the size of the package better than a semiconductor apparatus utilizing the wire structure to couple each of the plurality of chips through, for example, edge-wiring.

SUMMARY

In an embodiment, a stacked memory device may be provided. The stacked memory device may include a core chip and a base chip. The base chip may include a data receiver configured to receive data outputted from the core chip through a first normal port. The base chip may include a strobe signal generation unit configured to generate a data strobe signal based on one of a normal strobe signal and a test strobe signal depending on an operation mode. The test strobe signal may be generated based on a signal received through a first test port. The base chip may include a test register configured to store data outputted from the data receiver in response to the data strobe signal.

In an embodiment, a stacked memory device may be provided. The stacked memory device may include a core chip and a base chip. The base chip may include a data receiver configured to receive data outputted from the core chip through a first normal port. The stacked memory device may include a test register configured to store data outputted from the data receiver in synchronization with a test strobe signal generated based on a signal received through a first test port and output the stored data through a second test port.

DETAILED DESCRIPTION

Various examples of the embodiments may be directed to a stacked memory device capable of performing its own normal operation test and micro bump characteristic test without a connection to a controller. A system including the stacked memory devices are described herein.

Figure 1:
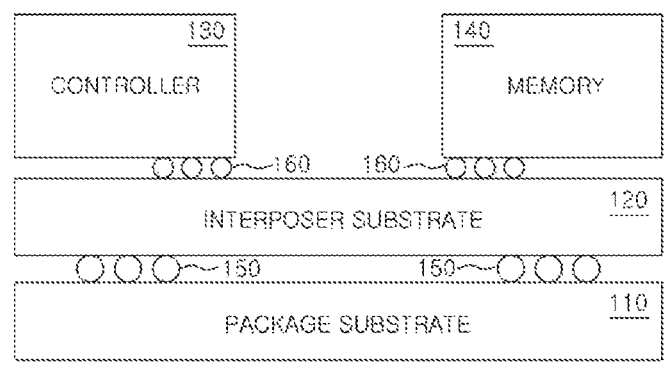
FIG. 1 is a diagram illustrating a representation of an example of the configuration of a system according to an embodiment.

Referring to FIG. 1, a system 1 according to an embodiment may include a package substrate 110, and an interposer substrate 120. The system 1 may include a controller 130, and memory 140. The interposer substrate 120 may be stacked over the package substrate 110. The package substrate 110 may be electrically coupled to the interposer substrate 120 through electrical coupling means 150, such as for example but not limited to bump balls, ball grid arrays, or C4 bumps. A signal path may be formed in the interposer substrate 120 and the package substrate 110. Although not illustrated, the package substrate 110 may include package balls. The system may be electrically coupled to an external electronic device through, for example, the package balls.

The controller 130 and the memory 140 may be stacked over the interposer substrate 120 and may be electrically coupled through micro bumps 160. The controller 130 may communicate with the memory 140 through the signal path formed in the interposer substrate 120. The elements of the system may be packaged into a single package and may be implemented using a form, such as a System on Chip (SoC), a System In Package (SIP), a multi-chip package, or a flip-chip package.

The controller 130 may include a master device for controlling the memory 140. The controller 130 may include a Central Processing Unit (CPU), a Graphic Processing Unit (GPU), a Digital Signal Processor (DSP), an Application Processor (AP), a controller chip, or a memory controller chip.

The memory 140 may include a slave device controlled by the controller 130. The memory 140 may include a volatile memory device, such as DRAM or may include a non-volatile memory device, such as a flash memory device, a phase change memory device (PCRAM), a resistive memory device (ReRAM), a ferroelectric memory device (FeRAM), a magnetic memory device (MRAM), or a spin injection magnetic memory device (STTRAM). Alternatively, the memory 140 may include a combination of two or more of the volatile memory device and the non-volatile memory devices. In an embodiment, the memory 140 may be a stacked memory device including a plurality of chips.

Figure 2:
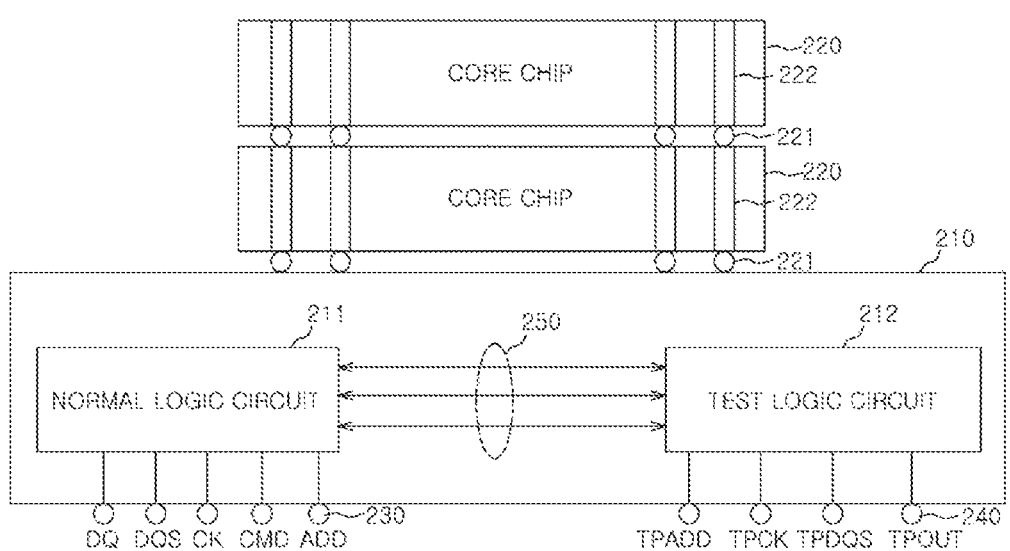
FIG. 2 is a diagram illustrating a representation of an example of schematic configuration of a stacked memory device according to an embodiment.

FIG. 2 is a diagram illustrating a representation of an example of schematic configuration of a stacked memory device 2 according to an embodiment. Referring to FIG. 2, the stacked memory device 2 may include a base chip 210 and a plurality of core chips 220. The base chip 210 and the plurality of core chips 220 may be electrically coupled through micro bumps 221 and through vias 222. For example, the base chip 210 may send data to be stored in a core chip 220 through the micro bumps 221 and the through vias 222 and receive data stored in a core chip 220. The number of core chips 220 has been illustrated as being two, but this is not intended to limit the number of core chips. There may be more or less than two core chips 220. The stacked memory device 2 may be included in the memory 140 illustrated in FIG. 1. The stacked memory device 2 may be used as the memory 140 illustrated in FIG. 1. Each of the plurality of core chips 220 may include data storage spaces, such as for example but not limited to memory cell arrays, memory registers, and memory banks for storing data transmitted by the base chip 210.

The base chip 210 may include a normal logic circuit 211 and a test logic circuit 212. The normal logic circuit 211 may include a circuit for controlling all the normal operations, such as for example but not limited to the write operation, read operation, and refresh operation of the stacked memory device 2. The test logic circuit 212 may include all the circuits for the test of the stacked memory device 2. The test logic circuit 212 may include various circuits related to tests, such as for example but not limited to a built-in self test circuit, a self repair circuit, and a self stress circuit. The test logic circuit 212 may perform various test operations, such as for example but not limited to the connective test of the through vias or micro bumps, a boundary scan test, a wafer level test, a wafer burn-in test, data input/output tests, and a data compression test. The test logic circuit 212 may include repair logic capable of substituting fail memory cells with redundancy cells.

The base chip 210 of the stacked memory device 2 may include a plurality of normal ports 230 and a plurality of test ports 240. The plurality of normal ports 230 may receive various control signals for the normal operation of the stacked memory device 2 from the controller 130 of FIG. 1. For example, the plurality of normal ports 230 may receive data DQ, a data strobe signal DQS, a clock signal CK, a command signal CMD, and an address signal ADD from the controller 130 through the plurality of normal ports 230. The controls signals received through the plurality of normal ports 230 may be input to the normal logic circuit 211. The normal logic circuit 211 enables the stacked memory device 2 to perform a normal operation. The plurality of test ports 240 may be accessed by another external device, such as, for example but not limited to, test equipment, directly and/or independently regardless of the controller 130, and may receive various control signals for a test operation from the external device. For example, control signals, such as for example but not limited to a test address signal TPADD, a test clock signal TPCK, and a port strobe signal TPDQS, may be received from the external device through the plurality of test ports 240. The control signals received through the plurality of test ports 240 may be input to the test logic circuit 212. The test logic circuit 212 may enable the stacked memory device 2 to perform a test operation. The test logic circuit 211 may output a test result TPOUT through one or more test ports. The test result TPOUT is data or a result of operation of the data.

Both the plurality of normal ports 230 and the plurality of test ports 240 may be micro bump pads. The normal ports 230 may communicate with an external device through the controller 130, and the test port 240 may communicate with an external device independently of the controller 130. The normal ports 230 may be normal pads, and the test ports 240 may be direct access pads. In an embodiment, the test logic circuit 212 may generate a signal for a test operation based on a signal received through the test port 240 and send the signal to the normal logic circuit 211 through links 250 between the normal logic circuit 211 and the test logic circuit 212. For example, the test logic circuit 212 may generate a signal for a test operation so that the normal logic circuit 211 operates without control of the controller 130. The test logic circuit 212 enables the normal operation test of the stacked memory device 2. The test logic circuit 212 may receive a normal operation test result from the normal logic circuit 211 through the links 250 and output the received test result TPOUT through the test port 240.

Figure 3:
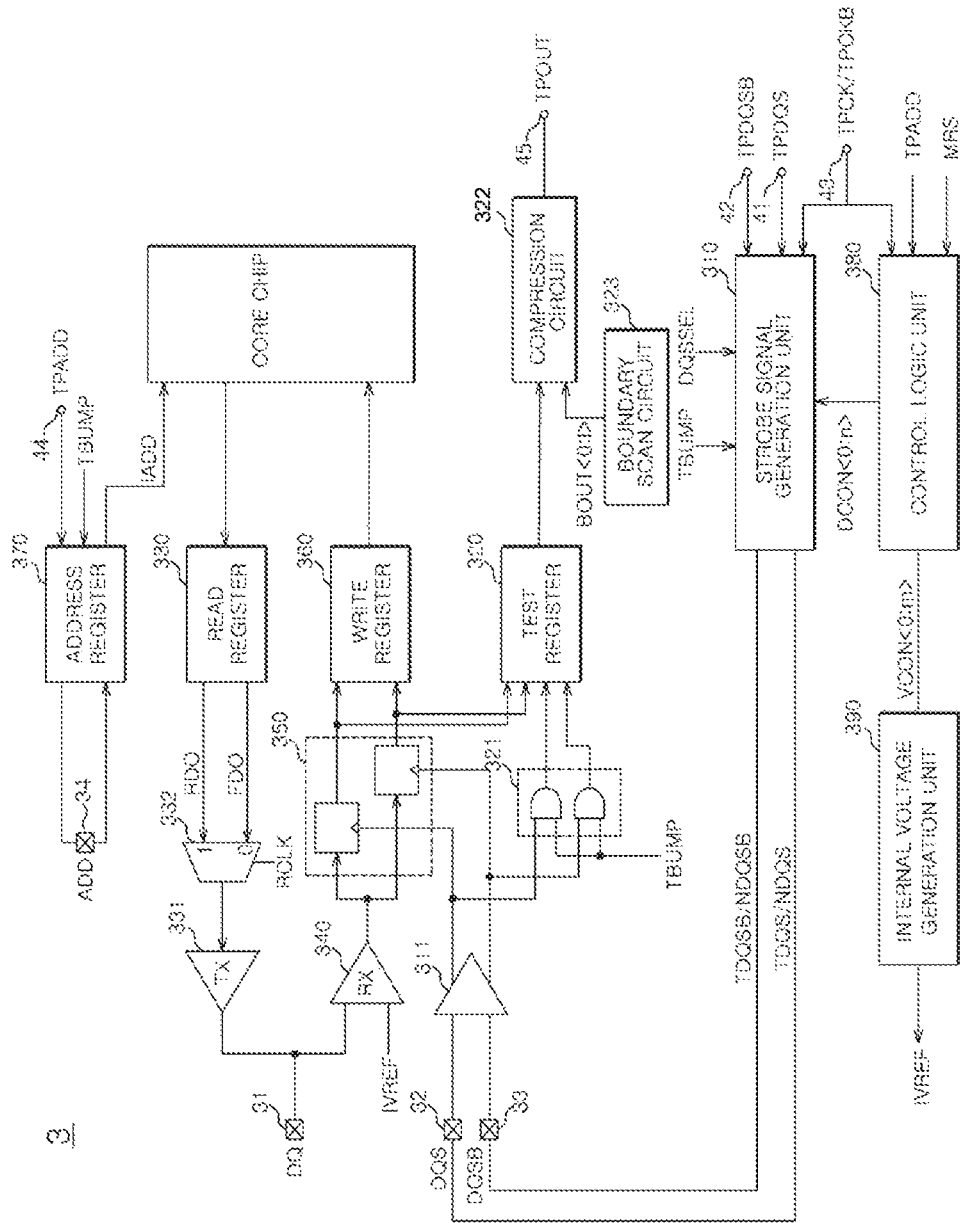
FIG. 3 is a diagram illustrating a representation of an example of the elements of a stacked memory device according to an embodiment.

FIG. 3 is a diagram illustrating a representation of an example of the elements of a stacked memory device 3 according to an embodiment. Referring to FIG. 3, the stacked memory device 3 may include a core chip and a base chip. All the elements other than the core chip may be disposed in the base chip. The base chip may include a plurality of normal ports 31, 32, 33, and 34. The base chip may include a plurality of test ports 41, 42, 43, 44, and 45. The normal port 31 may be a data pad. The data pad may be the input/output path for data DQ. The normal port 31 may receive data transmitted by a controller during the normal operation of the stacked memory device 3 and may receive data outputted from the core chip during the test operation of the stacked memory device 3. The normal ports 32 and 33 may be data strobe pads, and may output data strobe signals DQS and DQSB. Two normal ports 32 and 33 may be configured in order to output differential data strobe signals DQS and DQSB, and may output a data strobe signal and the inversion signal of the data strobe signal. In general, when outputting data to the controller, a memory device may output information about a point of time when the data is output as the data strobe signals DQS and DQSB. For example, the data strobe signals DQS and DQSB may be a read data strobe signal.

The plurality of test ports 41, 42, 43, 44, and 45 may be a plurality of direct access pads. For example, the stacked memory device 3 may receive a port strobe signal TPDQS through the test port 41 and receive the inversion signal TPDQSB of the port strobe signal through the test port 42. For example, the stacked memory device 3 may receive a test address signal TPADD through the test port 44 and receive a test clock signal TPCK and the inversion signal TPCKB of the test clock signal through the test port 43. The test port 45 may be used as a path for outputting data or for outputting a test result during a test operation.

The base chip may include a read path, a write path, a strobe signal generation unit 310, and a test register 320. The read path may provide a path through which data stored in the core chip may be output to the outside of the stacked memory device 3 through a read operation. The read path may include a read register 330 and a data transceiver 331. The read register 330 may store data that is stored in the core chip and output during a read operation. The data transceiver 331 may output data, stored in the read register 330, to the normal port 31. A multiplexer 332 may be coupled between the read register 330 and the data transceiver 331. The multiplexer 332 may output data, received from the read register 330, to the data transceiver 331 in response to an output control signal RCKD. The multiplexer 332 may be used for a double data rate operation, and may alternately output rising data RDO and falling data FDO in synchronization with the rising edge and falling edge of the output control signal RCKD.

The write path may include a data receiver 340, a data latch unit 350, and a write register 360. The data receiver 340 may be electrically coupled to the normal port 31, and may receive data through the normal port 31. The data receiver 340 may receive data transmitted by the controller through the normal port 31 in normal operation mode. The data receiver 340 may receive data, outputted from the core chip, through the normal port 31 in a test operation mode. The data outputted from the core chip may be sent to the normal port 31 through the read path. The data receiver 340 may receive the data outputted from the core chip through the normal port 31. The data receiver 340 may compare the data outputted from the core chip with an internal reference voltage IVREF and generate an output signal.

The data latch unit 350 may latch a signal, outputted from the data receiver 340, as data strobe signals DQS and DQSB. The write register 360 may store the output of the data latch unit 350 and send the stored data to the core chip.

The strobe signal generation unit 310 may provide one of a pair of normal strobe signals NDQS and NDQSB and a pair of test strobe signals TDQS and TDQSB as a data strobe signal pair DQS and DQSB depending on the operation mode. The strobe signals may be differential signals. The strobe signal generation unit 310 may be electrically coupled to the normal ports 32 and 33, and may output one of the normal strobe signals NDQS and NDQSB and the test strobe signals TDQS and TDQSB to the normal ports 32 and 33. The strobe signal generation unit 310 may generate the test strobe signals TDQS and TDQSB based on the port strobe signals TPDQS and TPDQSB received through the test ports 41 and 42. For example, the strobe signal generation unit 310 may output the normal strobe signals NDQS and NDQSB to the normal ports 32 and 33 or output the test strobe signals TDQS and TDQSB to the normal ports 32 and 33 in response to an operation mode signal TBUMP. The operation mode signal TBUMP may include a signal having information about operation mode of the stacked memory device 3. When, for example, the operation mode signal TBUMP is enabled, the stacked memory device 3 may enter a test operation mode. When, for example, the operation mode signal TBUMP is disabled, the stacked memory device 3 may terminate the test operation mode.

The strobe signal generation unit 310 may generate the test strobe signals TDQS and TDQSB based on one of the port strobe signals TPDQS and TPDQSB received through the test ports 41 and 42 and the test clock signals TPCK and TPCKB received through the test port 43 in response to a strobe selection signal DQSSEL. A configuration and function of the strobe signal generation unit 310 are described later.

The normal ports 32 and 33 may be electrically coupled to the data latch unit 350 and the test register 320 through a buffer 311. The data strobe signals DQS and DQSB may be input to the data latch unit 350 and the test register 320 through the normal ports 32 and 33. The test register 320 may store data outputted from the data latch unit 350 in response to the data strobe signals DQS and DQSB. In the test operation mode, since the strobe signal generation unit 310 outputs the test strobe signals TDQS and TDQSB as the data strobe signals DQS and DQSB, the test register 320 may store data outputted from the core chip in synchronization with the test strobe signals TDQS and TDQSB.

A register enable unit 321 may be electrically coupled between the buffer 311 and the test register 320. The register enable unit 321 may enable the data strobe signals DQS and DQSB to be selectively input to the test register 320 depending on the operation mode. When the operation mode signal TBUMP is enabled, the register enable unit 321 may output the data strobe signals DQS and DQSB, received from the normal pads 32 and 33, to the test register 320. When the operation mode signal TBUMP is disabled, the register enable unit 321 may block the output of the data strobe signals DQS and DQSB to the test register 320. For example, the register enable unit 321 enables the test register 320 to receive only the test strobe signals TDQS and TDQSB during the test operation of the stacked memory device 3. The register enable unit 321 may include AND gates for respectively receiving the operation mode signal TBUMP and the data strobe signals DQS and DQSB.

The test register 320 may store data outputted from the core chip and output the stored data through the test port 45. The test register 320 may include a storage space for storing data outputted from the core chip and may include, for example but not limited to, a Multiple Input Signature Register (MISR). The MISR may be a circuit capable of performing specific operation on an input signal, comparing a result of the operation with an estimation value, and determining a pass or fail. The test register 320 may receive data outputted from the core chip, may perform specific operation on the data, and may output a result of a comparison between a result of the operation of the data and an estimation value through the test port 45. A signal TPOUT output through the test port 45 may be data or a test result based on the data.

The base chip may include an address register 370. The address register 370 may receive an address signal ADD transmitted by the controller through the normal port 34 in the normal operation mode. The address register 370 may receive a test address signal TPADD, received through the test port 44, through the normal port 34 in response to the operation mode signal TBUMP while in the test operation mode. The address register 370 may generate an internal address signal IADD based on the received normal address signal ADD and test address signal TPADD and output an internal address signal IADD to the core chip. The internal address signal IADD may include the address of a storage space in which data that belongs to data stored in the core chip and that is to be output is stored.

The base chip may include a control logic unit 380 and an internal voltage generation unit 390. The control logic unit 380 may generate a delay control signal DCON<0:n> and a voltage control signal VCON<0:m>. The control logic unit 380 may generate the delay control signal DCON<0:n> and the voltage control signal VCON<0:m> in response to the test address signal TPADD. The control logic unit 380 may generate the delay control signal DCON<0:n> based on memory resetting information MRS together with the test address signal TPADD. The memory resetting information MRS may include information about the operation of the stacked memory device 3 and may include information stored in a state machine, such as, for example but not limited to, a mode register set and an extension mode register set. For example, the memory resetting information MRS may include information, such as read latency and a clock phase difference. The control logic unit 380 may include a decoding circuit for generating the delay control signal DCON<0:n> and the voltage control signal VCON<0:m> by decoding the test address signal TPADD and the memory resetting information MRS.

The internal voltage generation unit 390 may receive the voltage control signal VCON<0:m> and generate the internal reference voltage IVREF. The internal voltage generation unit 390 may increase or decrease the level of the internal reference voltage IVREF based on the voltage control signal VCON<0:m>. The internal voltage generation unit 390 may be implemented using a common voltage control circuit for changing the level of the internal reference voltage IVREF in response to the voltage control signal VCON<0:m>.

The base chip may include a compression circuit 322 and a boundary scan circuit 323. The compression circuit 322 may be electrically coupled between the test register 320 and the test port 45. The compression circuit 322 may receive data stored in the test register 320, may compress the received data, and may output the compressed data. The compression circuit 322 may compress data for each byte and output a compression test result through the test port 45. When the compression circuit 322 performs a compression operation for each byte, the boundary scan circuit 323 may prevent data of specific bits from being compressed. The boundary scan circuit 323 may generate a boundary scan control signal BOUT<0:1>. The compression circuit 322 may not compress data of specific bits when performing a compression operation for each byte in response to the boundary scan control signal BOUT<0:1>.

The stacked memory device 3 may perform a normal operation without being electrically coupled to a controller because the stacked memory device 3 may include the test ports 41, 42, 43, 44, and 45, so a normal operation test may be enabled. A signal generated based on a signal input to the test ports 41, 42, 43, 44, 45 and a signal received through the test ports 41, 42, 43, 44, 45 may be transmitted to the normal ports 31, 32, 33, 34. Accordingly, the characteristic test of micro bumps that form the normal ports 31, 32, 33, and 34 may be possible.

Figure 4:
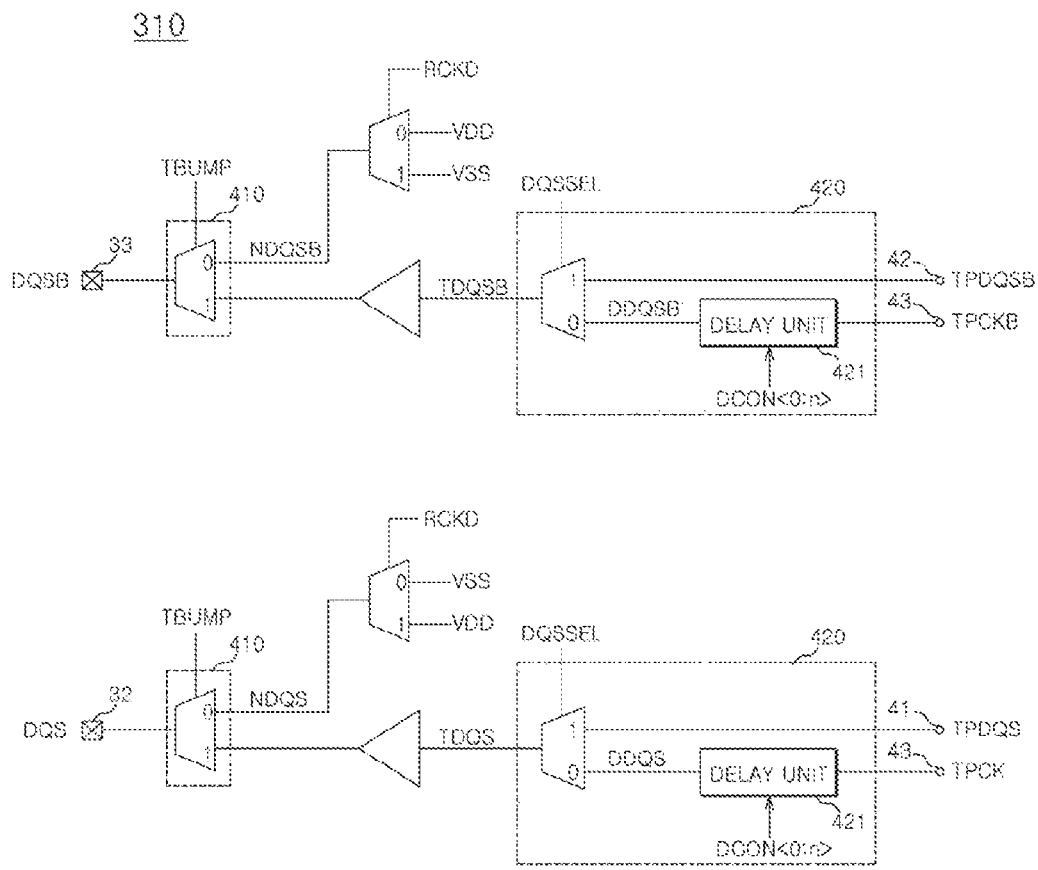
FIG. 4 is a diagram illustrating a representation of an example of the configuration of a strobe signal generation unit illustrated in FIG. 3.

FIG. 4 is a diagram illustrating a representation of an example of the configuration of the strobe signal generation unit 310 illustrated in FIG. 3. Referring to FIG. 4, the strobe signal generation unit 310 may include a strobe selection unit 410 and a timing control unit 420. The strobe selection unit 410 may provide one of the normal strobe signals NDQS and NDQSB and the test strobe signals TDQS and TDQSB as the data strobe signals DQS and DQSB depending on the operation mode. The strobe selection unit 410 may output one of the normal strobe signals NDQS and NDQSB and the test strobe signals TDQS and TDQSB to the normal ports 32 and 33 in response to the operation mode signal TBUMP. For example, when, for example, the operation mode signal TBUMP is enabled while in the test operation mode, the strobe selection unit 410 may output the test strobe signals TDQS and TDQSB as the data strobe signals DQS and DQSB. When, for example, the operation mode signal TBUMP is disabled during a normal operation, the strobe selection unit 410 may output the normal strobe signals NDQS and NDQSB as the data strobe signals DQS and DQSB. The strobe selection unit 410 may be implemented using a multiplexer controlled by the operation mode signal TBUMP and configured to output one of the normal strobe signals NDQS and NDQSB and the test strobe signals TDQS and TDQSB.

The timing control unit 420 may output one of the port strobe signals TPDQS and TPDQSB and the delay strobe signals DDQS and DDQSB, received through the test ports 41 and 42, as the test strobe signals TDQS and TDQSB. The timing control unit 420 may be implemented using a multiplexer controlled by the strobe selection signal DQSSEL and configured to output one of the port strobe signals TPDQS and TPDQSB and the delay strobe signals DDQS and DDQSB. The port strobe signals TPDQS and TPDQSB may be directly received from an external device through the test ports 41 and 42 and may be signals whose phases are controlled by the external device. The strobe selection signal DQSSEL may include any signal which may be used in the stacked memory device 3. For example, the strobe selection signal DQSSEL may be generated based on the test address signal TPADD (i.e., see FIG. 3). The delay strobe signals DDQS and DDQSB may be generated based on the test clock signals TPCK and TPCKB received through the test port 43. The timing control unit 420 may further include a delay unit 421. The delay unit 421 may generate the delay strobe signals DDQS and DDQSB by delaying the test clock signals TPCK and TPCKB received through the test port 43. The delay unit 421 may delay the test clock signals TPCK and TPCKB based on the delay control signal DCON<0:m>. The test strobe signals TDQS and TDQSB outputted from the timing control unit 420 may be input to the strobe selection unit 410 through a buffer.

The normal strobe signals NDQS and NDQSB may be generated based on the output control signal RCKD. The normal strobe signals NDQS and NDQSB may be implemented using a multiplexer for receiving the power supply voltage VDD and the ground voltage VSS. The output control signal RCKD may be toggled like the clock signal. The multiplexer may generate the normal strobe signals NDQS and NDQSB by alternately outputting the power supply voltage VDD and the ground voltage VSS when, for example, the output control signal RCKD is in a high level section and a low level section.

Figure 5:
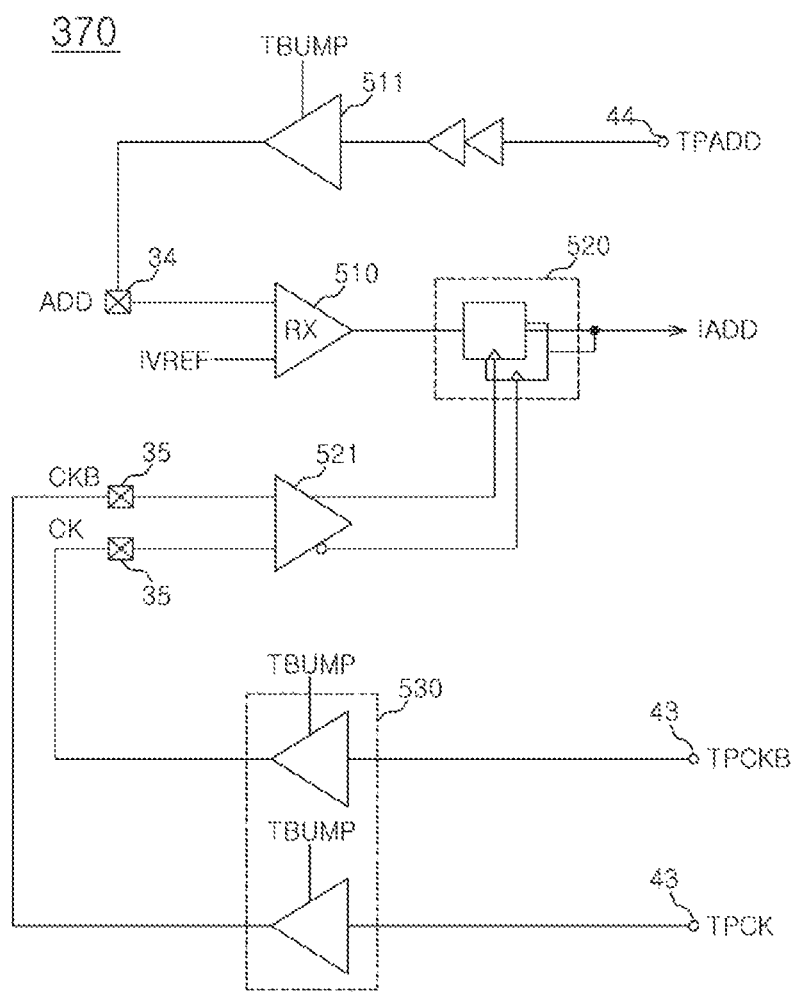
FIG. 5 is a diagram illustrating a representation of an example of an address register illustrated in FIG. 3 and added elements electrically coupled to the address register.

FIG. 5 is a diagram illustrating a representation of an example of the address register 370 illustrated in FIG. 3 and added elements electrically coupled to the address register 370. Referring to FIG. 5, the address register 370 may include an address receiver 510 and an address latch unit 520. The address receiver 510 may be electrically coupled to the normal port 34. The stacked memory device 3 may receive the address signal ADD transmitted by the controller through the normal port 34 while in the normal operation mode. While in the test operation mode, the test port 44 may receive the test address signal TPADD. The test address signal TPADD may be input to the normal port 34 through a buffer 511 controlled by the operation mode signal TBUMP. While in the test operation mode of the stacked memory device 3, the address receiver 510 may receive the test address signal TPADD through the normal port 34. The address receiver 510 may compare a signal transmitted by the normal port 34 with the internal reference voltage IVREF and generate an output signal.

The address latch unit 520 may latch the signal outputted from the address receiver 510 in synchronization with the clock signals CK and CKB. The address latch unit 520 may receive the clock signals CK and CKB from the normal port 35. The clock signals CK and CKB may be input as differential signals. The clock signals CK and CKB received through the normal port 35 may be provided to the address latch unit 520 through the buffer 521. The normal port 35 may receive the clock signals CK and CKB from the controller while in the normal operation mode of the stacked memory device 3. While in the test operation mode of the stacked memory device 3, the normal port 35 may receive the test clock signals TPCK and TPCKB received through the test port 43.

The stacked memory device 3 may include a test clock input unit 530. The test clock signals TPCK and TPCKB received through the test port 43 may be provided to the normal port 35 through the test clock input unit 530. When, for example, the operation mode signal TBUMP is enabled, the test clock input unit 530 may output the test clock signals TPCK and TPCKB to the normal port 35. While in the test operation mode, the address latch unit 520 may latch the output of the address receiver 510 based on the test clock signals TPCK and TPCKB and output the latched signal as the internal address signal IADD.

Figure 6:
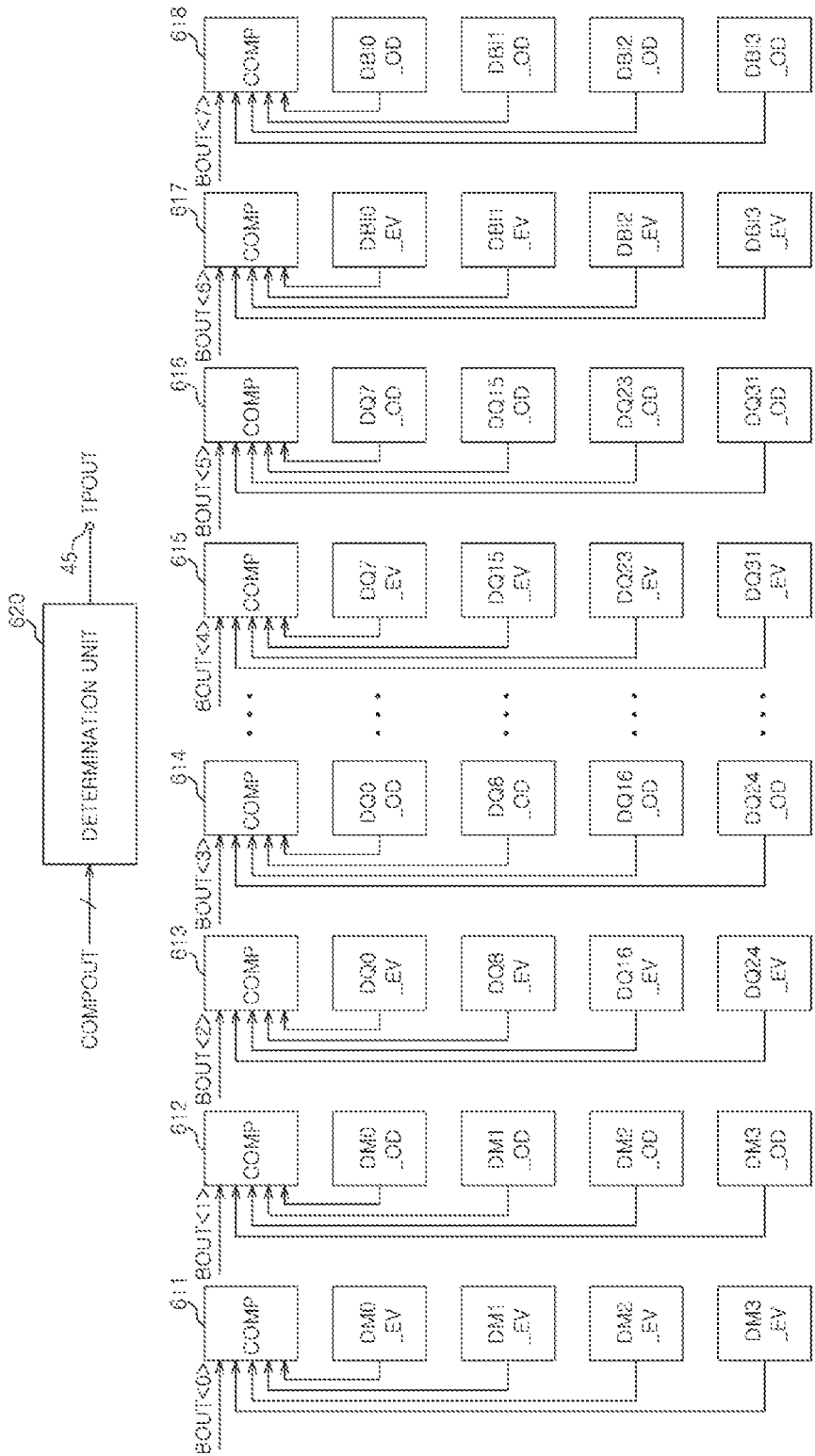
FIG. 6 is a diagram illustrating a representation of an example of the configuration of a compression circuit illustrated in FIG. 3.

FIG. 6 is a diagram illustrating a representation of an example of the configuration of the compression circuit 322 illustrated in FIG. 3. Referring to FIG. 6, the stacked memory device 3 may, for example but not limited to, input and output data of 32 bits as four group data. One group data may include information of 20 bits. The test register 420 may output the four group data. Each of the four group data may include data mask information of 2 bits, data of 16 bits, and data bus inversion information of 2 bits. The stacked memory device 3 supports a double data rate, and thus each bit may include an even bit and an odd bit. The compression circuit 322 may include a plurality of compression units COMP 611-618. The compression circuit 322 may include a determination unit 620. Each of the plurality of compression units 611-618 may perform a compression operation for each byte. The compression unit 611 may compress first to fourth even data mask bits DM0_EV, DM1_EV, DM2_EV, and DM3_EV. The compression unit 612 may compress first to fourth odd data mask bits DM0_OD, DM1_OD, DM2_OD, and DM3_OD. The compression unit 613 may compress a first even data bit DQ0_EV, a ninth even data bit DQ8_EV, a seventeenth even data bit DQ16_EV, and a twenty-fifth even data bit DQ24_EV. The compression unit 614 may compress a first odd data bit DQ0_OD, a ninth odd data bit DQ8_OD, a seventeenth odd data bit DQ16_OD, and a twenty-fifth odd data bit DQ24_OD. The compression unit 615 may compress an eighth even data bit DQ7_EV, a sixteenth even data bit DQ15_EV, a twenty-fourth even data bit DQ23_EV, and a thirty-second even data bit DQ31_EV. The compression unit 616 may compress an eighth odd data bit DQ7_OD, a sixteenth odd data bit DQ15_OD, a twenty-fourth odd data bit DQ23_OD, and a thirty-second odd data bit DQ31_OD. The compression unit 617 may compress first to fourth even data bus inversion bits DBI0_EV, DBI0_EV, DBI0_EV, and DBI3_EV. The compression unit 618 may compress first to fourth odd data bus inversion bits DBI0_OD, DBI0_OD, DBI0_OD, and DBI3_OD. Each of the compression units 611-618 may perform a compression operation on data that belongs to the group data and that has the same sequence for each byte, thus being capable of increasing efficiency and reliability of a data compression test. The pattern of each of the group data may be freely set and changeable because each of the compression units 611-618 performs a compression operation for each byte. Since the four group data has the same data pattern, data having the same sequence may be the same although the pattern of each of the four group data is freely set and changeable.

The compression units 611-618 may receive the boundary scan control signals BOUT<0:7> outputted from the boundary scan circuit 323 (i.e., see FIG. 3). The compression units 611-618 may prevent specific data belonging to compressed data of 4 bits and having 1 bit from being compressed based on the boundary scan control signals BOUT<0:7>. For example, if a result of the compression of the first to fourth even data mask bits DM0_EV, DM1_EV, DM2_EV, and DM3_EV by the compression unit 611 is a fail, the compression unit 611 may generate a result of the compression by sequentially excluding the first to fourth even data mask bits DM0_EV, DM1_EV, DM2_EV, and DM3_EV one by one in response to the boundary scan control signal BOUT<O>. For example, the compression unit 611 may compress the second to fourth even data mask bits DM1_EV, DM2_EV, and DM3_EV other than the first even data mask bit DM0_EV. In this example, if a result of the compression of the second to fourth even data mask bits DM1_EV, DM2_EV, and DM3_EV is a pass, it may be easily detected that a fail has occurred in the first even data mask bit DM0_EV. The determination unit 620 may compress a compression test result COMPOUT, outputted from the compression unit 611-618, again and output a test result signal TPOUT to the test port 45.

Figure 7:
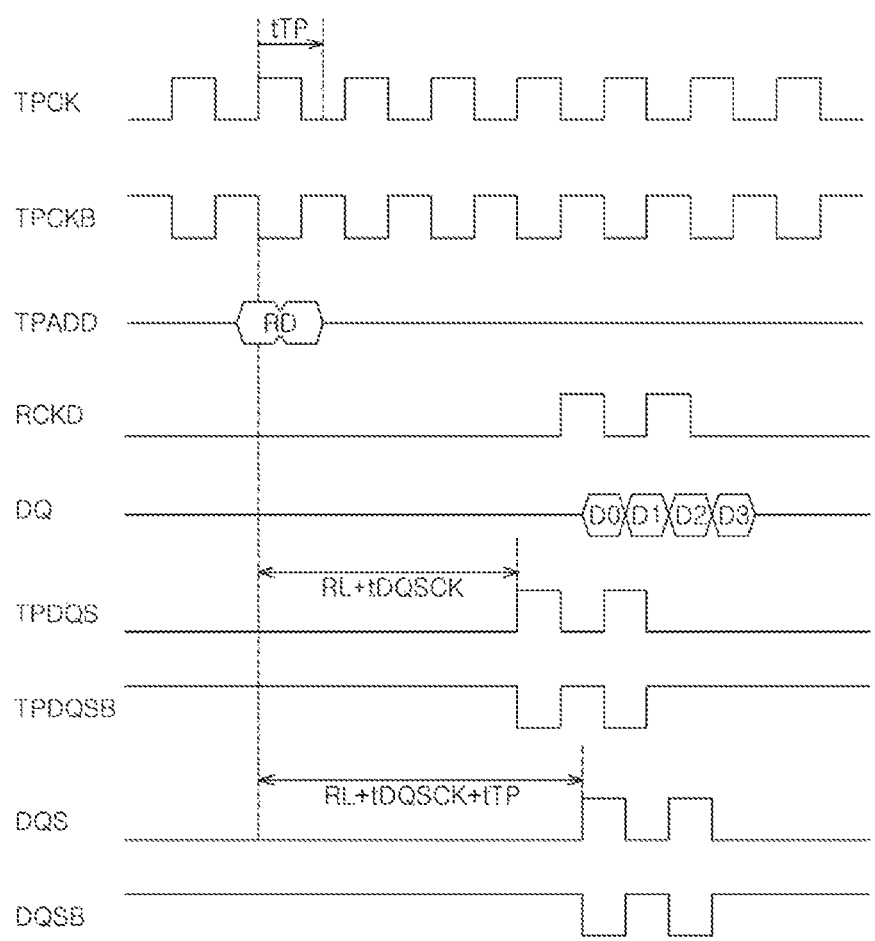
FIG. 7 is a diagram illustrating a representation of an example of an operation of the stacked memory device according to an embodiment.

FIG. 7 is a diagram illustrating a representation of an example of an operation of the stacked memory device 3 according to an embodiment. The operation of the stacked memory device 3 according to an embodiment is described below with reference to FIGS. 3 to 7. When, for example, the operation mode signal TBUMP is enabled, the stacked memory device 3 may enter a test operation mode. During the test operation mode, the test clock signals TPCK and TPCKB may be received through the test port 43, and the test address signal TPADD having read command information RD may be received for the read operation of the stacked memory device 3. After a lapse of a specific time since the test address signal TPADD having the read command information RD is received, the output control signal RCKD may be generated. When the output control signal RCKD is generated, data DQ D0, D1, D2, and D3 outputted from the core chip and stored in the read register 330 may be output to the normal port 31. Thereafter, the port strobe signals TPDQS and TPDQSB may be input through the test ports 41 and 42. When, for example, the strobe selection signal DQSSEL is enabled, the timing control unit 420 may output the port strobe signals TPDQS and TPDQSB as the test strobe signals TDQS and TDQSB, and the strobe selection unit 410 may output the test strobe signals TDQS and TDQSB to the normal ports 32 and 33 as the data strobe signals DQS and DQSB.

The data receiver 340 may compare data outputted from the normal port 31 with the internal reference voltage IVREF and receive a result of the comparison. The data latch unit 350 may latch the output of the data receiver 340 in synchronization with data strobe signals (i.e., the test strobe signals TDQS and TDQSB) provided by the normal ports 32 and 33. The test register 320 may store the output of the data latch unit 350. Accordingly, the test register 320 may store data outputted from the core chip through the normal port 31.

The port strobe signals TPDQS and TPDQSB may be input later by a time based on read latency RL and a clock phase difference tDQSCK after the test address signal TPADD having the read command information RD is received. The read latency RL may mean a delay time from a point of time at which the stacked memory device 3 receives a read command to a point of time at which data is actually output. The clock phase difference tDQSCK may mean the time during which the normal clock signal that may be input from the controller is delayed within the stacked memory device 3. A time tTP may mean a time delay from the time when the test clock signals TPCK and TPCKB and the port strobe signals TPDQS and TPDQSB are input to the test ports 41, 42, and 43 to the time when the test clock signals TPCK and TPCKB and the port strobe signals TPDQS and TPDQSB are transmitted to the logic circuit after the normal ports 31, 32, and 33 and the normal ports 31, 32, and 33 are electrically coupled. Both the test address signal TPADD and the port strobe signals TPDQS and TPDQSB may be input to the test ports 41, 42, and 44 and transmitted to the logic circuit of the stacked memory device 3. Accordingly, the time tTP may be offset, and additional timing control may not be necessary. Referring to FIG. 7, a point of time at which the data D0, D1, D2, and D3 is output while the test address TPADD is transmitted from the test port to the normal port may be delayed by the time tTP. In contrast, since the port strobe signals TPDQS and TPDQSB are also transmitted from the test port to the normal port, a point of time at which the data strobe signals DQS and DQSB are generated is delayed by the time tTP. Accordingly, the point of time at which the data D0, D1, D2, and D3 is output may be synchronized with the point of time at which the data strobe signals DQS and DQSB are output. Data stored in the test register 320 may be output through the test port 45 after being compressed by the compression circuit 322 or without being compressed. Whether the micro bumps forming the normal ports 31, 32, 33, 34, and 35 are operating normally or not may be determined by monitoring whether a signal output through the test port 45 is normal (i.e., expected) or not (i.e., not expected).

Figure 8:
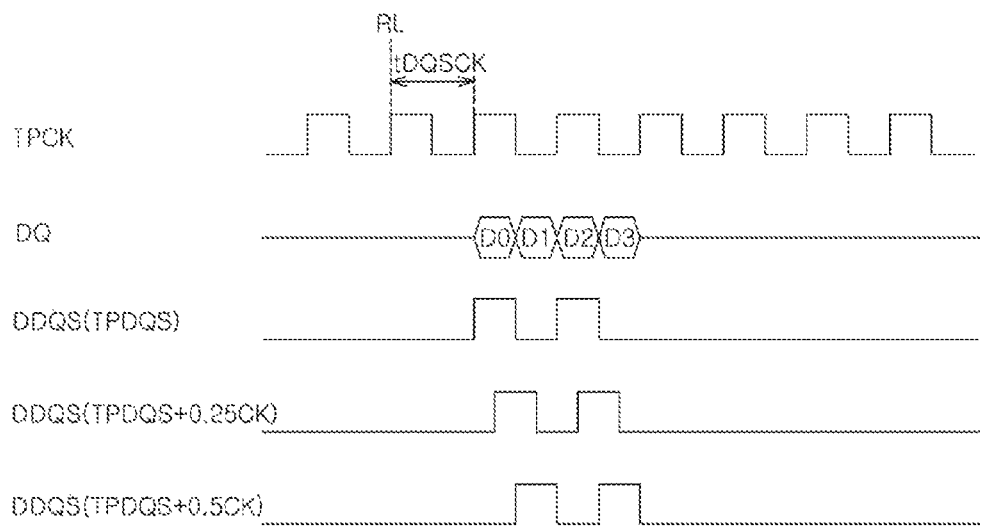
FIG. 8 is a diagram illustrating a representation of an example of an operation of the stacked memory device when delay strobe signals are generated using a timing control unit.

FIG. 8 is a diagram illustrating a representation of an example of an operation of the stacked memory device 3 when the delay strobe signals DDQS and DDQSB are generated using the timing control unit 420 (i.e., see FIGS. 3 and 4). Referring to FIG. 8, the timing control unit 420 may generate the delay strobe signals DDQS and DDQSB by delaying the test clock signals TPCK and TPCKB in response to the test address signal TPADD and the delay control signal DCON<0:n> generated based on the memory resetting information MRS. For example, the delay unit 421 may generate the delay strobe signal DDQS having the same phase as the port strobe signal TPDQS by delaying the test clock signal TPCK. In this example, the delay unit 421 may change the phase of the delay strobe signal DDQS based on the delay control signal DCON<0:n>. For example, if the edge of the delay strobe signal DDQS (TPDQS) is synchronized with a point of time at which the data DQ D0, D1, D2, D3 shifts, the edge of the delay strobe signal DDQS (TPDQS+0.25CK) delayed by the ¼ cycle of the test clock signal TPCK may be placed at the central part of a data-valid section. For example, the edge of the delay strobe signal DDQS (TPDQS+0.5CK) delayed by the ½ cycle of the test clock signal TPCK may be synchronized with a point of time at which the data D1, D2, D3 shifts after the first data D0 of the data DQ. The stacked memory device 3 may provide the delay strobe signal DDQS having various phases as the test strobe signal TDQS using the timing control unit 420. Accordingly, an optimal phase of the test strobe signal TDQS that may be synchronized with the data DQ may be set, and optimal timing margin setting may be possible according to the characteristics of the normal ports 31, 32, and 33.

Figure 9:
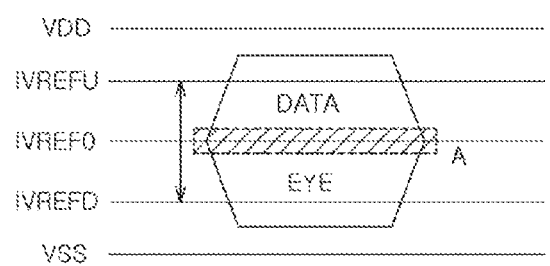
FIG. 9 is a diagram illustrating a representation of an example of the relationship between the valid window of data and an internal reference voltage.

FIG. 9 is a diagram illustrating a representation of an example of the relationship between the valid window of data DATA EYE and the internal reference voltage IVREF. For example, it may be assumed that data outputted from the core chip has a distribution corresponding to a section A while passing through the normal port 31. In this example, the data receiver 340 can accurately receive the data if it compares the data, distributed in the section A, with the internal reference voltage IVREF. If the internal reference voltage generation unit 390 increases (IVREFU) the level of the internal reference voltage IVREF or decreases (IVREFD) the level of the internal reference voltage IVREF based on the voltage control signal VCON<0:m>, the data receiver 340 may be unable to accurately receive the data distributed in the section A. Accordingly, the stacked memory device 3 may determine whether there is a fail in the micro bumps forming the normal port 31 while changing the level of the internal reference voltage IVREF.

Figure 10:
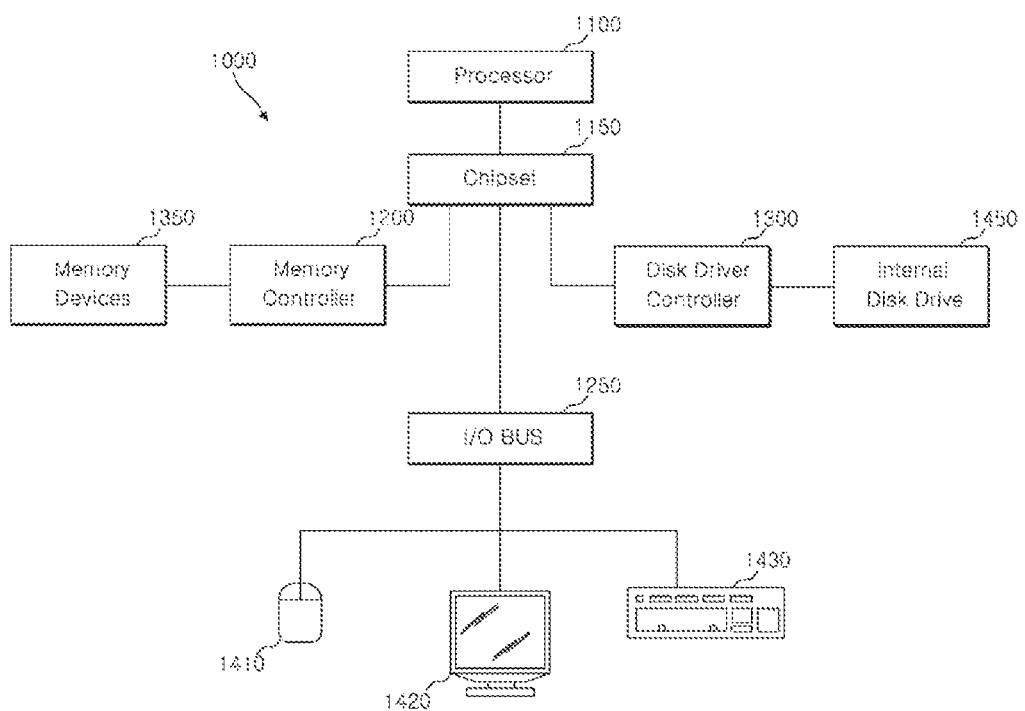
FIG. 10 illustrates a block diagram of an example of a representation of a system employing a stacked memory device in accordance with the various embodiments discussed above with relation to FIGS. 1-9.

The stacked memory device discussed above (see FIGS. 1-9) are particular useful in the design of memory devices, processors, and computer systems. For example, referring to FIG. 10, a block diagram of a system employing the stacked memory device in accordance with the various embodiments are illustrated and generally designated by a reference numeral 1000. The system 1000 may include one or more processors or central processing units ("CPUs") 1100. The CPU 1100 may be used individually or in combination with other CPUs. While the CPU 1100 will be referred to primarily in the singular, it will be understood by those skilled in the art that a system with any number of physical or logical CPUs may be implemented.

A chipset 1150 may be operably coupled to the CPU 1100. The chipset 1150 is a communication pathway for signals between the CPU 1100 and other components of the system 1000, which may include a memory controller 1200, an input/output ("I/O") bus 1250, and a disk drive controller 1300. Depending on the configuration of the system, any one of a number of different signals may be transmitted through the chipset 1150, and those skilled in the art will appreciate that the routing of the signals throughout the system 1000 can be readily adjusted without changing the underlying nature of the system.

As stated above, the memory controller 1200 may be operably coupled to the chipset 1150. The memory controller 1200 may include at least one stacked memory device as discussed above with reference to FIGS. 1-9. Thus, the memory controller 1200 can receive a request provided from the CPU 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one stacked memory device as discussed above with relation to FIGS. 1-9, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430. Further, the I/O bus 1250 may be integrated into the chipset 1150.

The disk drive controller 1450 (i.e., internal disk drive) may also be operably coupled to the chipset 1150. The disk drive controller 1450 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

It is important to note that the system 1000 described above in relation to FIG. 10 is merely one example of a system employing the stacked memory device as discussed above with relation to FIGS. 1-9. In alternate embodiments, such as cellular phones or digital cameras, the components may differ from the embodiments illustrated in FIG. 10.

While certain embodiments have been described above, it will be understood to those skilled in the art that the embodiments described are by way of example only. Accordingly, the device and system described herein should not be limited based on the described embodiments. Rather, the device and system described herein should only be limited in light of the claims that follow when taken in conjunction with the above description and accompanying drawings.

What is claimed is:

1. A stacked memory device, comprising:
a core chip and a base chip,
wherein the base chip comprises:
a data receiver configured to receive data outputted from the core chip through a first normal port;
a strobe signal generation unit configured to generate a data strobe signal based on one of a normal strobe signal and a test strobe signal depending on an operation mode, wherein the test strobe signal is generated based on a signal received through a first test port; and
a test register configured to store data outputted from the data receiver in response to the data strobe signal.

2. The stacked memory device according to claim 1, wherein the test register is configured to receive the data outputted from the core chip, perform an operation on the data, and output a result of a comparison between a result of the operation of the data and an estimation value through a second test port.

3. The stacked memory device according to claim 1, wherein the strobe signal generation unit comprises:
a strobe selection unit configured to output one of the normal strobe signal and the test strobe signal as the data strobe signal in response to an operation mode signal; and
a timing control unit configured to output one of a port strobe signal and a delay strobe signal received through the first test port as the test strobe signal in response to a strobe selection signal.

4. The stacked memory device according to claim 3, wherein the normal strobe signal is generated by a multiplexer configured to alternately output a power supply voltage and a ground voltage based on an output control signal.

5. The stacked memory device according to claim 3, wherein the timing control unit comprises a delay unit configured to generate a delay strobe signal by delaying a test clock signal received through a third test port based on a delay control signal.

6. The stacked memory device according to claim 5, further comprising a control logic unit configured to generate the delay control signal based on a test address signal received through the third test port and memory resetting information.

7. The stacked memory device according to claim 1, further comprising a data latch unit configured to receive the data strobe signal through a second normal port and latch the data outputted from the data receiver based on the data strobe signal,
wherein the test register receives and stores an output of the data latch unit based on the data strobe signal.

8. The stacked memory device according to claim 7, further comprising a register enable unit configured to selectively provide the data strobe signal to the test register depending on an operation mode signal.

9. The stacked memory device according to claim 1, further comprising a compression circuit configured to generate a compression test result by compressing the data stored in the test register for each byte and output the compression test result through the second test port.

10. The stacked memory device according to claim 9, further comprising a boundary scan circuit configured to generate a boundary scan control signal to prevent the compression circuit from compressing a specific bit of the data when the compression circuit performs a compression operation for each byte.

11. The stacked memory device according to claim 1, further comprising a read register configured to store data outputted from the core chip and output the stored data.

12. The stacked memory device according to claim 11, wherein the read register is configured to output the stored data to the first normal port.

13. A stacked memory device, comprising:
a core chip and a base chip,
wherein the base chip comprises:
a data receiver configured to receive data outputted from the core chip through a first normal port; and
a test register configured to store data outputted from the data receiver in synchronization with a test strobe signal generated based on a signal received through a first test port and output the stored data through a second test port.

14. The stacked memory device according to claim 13, wherein the test register is configured to receive the data outputted from the core chip, perform an operation on the data, and output a result of a comparison between a result of the operation of the data and an estimation value through the second test port.

15. The stacked memory device according to claim 14, wherein the test register is realized by a multiple input signature register (MISR).

16. The stacked memory device according to claim 13, wherein the test strobe signal is provided to the test register through a second normal port.

17. The stacked memory device according to claim 13, wherein the data receiver compares an internal reference voltage generated based on a test address signal received through a third test port with data outputted from the core chip and generates an output signal.

18. The stacked memory device according to claim 17, further comprising:
a control logic unit configured to generate a voltage control signal based on the test address signal received through the third test port; and
an internal voltage generation unit configured to change a level of the internal reference voltage based on the voltage control signal.

19. The stacked memory device according to claim 13, further comprising an address register configured to latch one of a normal address signal and the test address signal received through the third test port and output an internal address signal to the core chip.

20. The stacked memory device according to claim 19, wherein the address register comprises:
an address receiver configured to receive one of the normal address signal and the test address signal through a second normal port, compare the received signal with an internal reference voltage, and generate an output signal; and
an address latch unit configured to latch the output of the address receiver in synchronization with a test clock signal received through a fourth test port and generate the internal address signal.

21. The stacked memory device according to claim 20, further comprising a test clock input unit configured to selectively provide the test clock signal to the address latch unit depending on an operation mode signal.

22. The stacked memory device according to claim 13, wherein the first normal port, the first test port, and the second test port comprise micro bumps.

23. The stacked memory device according to claim 13, wherein the first normal port is electrically coupled to a controller.

24. The stacked memory device according to claim 23, wherein the first and the second test ports comprise direct access pads and are configured to allow direct access for an external device independently of the controller.

* * * * *